(12) United States Patent
Suto et al.

(10) Patent No.: US 12,235,295 B2
(45) Date of Patent: Feb. 25, 2025

(54) VOLTAGE MONITORING DEVICE

(71) Applicant: ABLIC Inc., Tokyo (JP)

(72) Inventors: Yoichi Suto, Tokyo (JP); Atsushi Sakurai, Tokyo (JP)

(73) Assignee: ABLIC Inc., Nagano (JP)

( * ) Notice: Subject to any disclaimer, the term of this patent is extended or adjusted under 35 U.S.C. 154(b) by 390 days.

(21) Appl. No.: 17/683,353

(22) Filed: Mar. 1, 2022

(65) Prior Publication Data

US 2022/0283204 A1 Sep. 8, 2022

(30) Foreign Application Priority Data

Mar. 3, 2021 (JP) ................................ 2021-033072

(51) Int. Cl.
*G01R 19/165* (2006.01)

(52) U.S. Cl.
CPC ... *G01R 19/1658* (2013.01); *G01R 19/16585* (2013.01)

(58) Field of Classification Search
CPC .......... G01R 19/1658; G01R 19/16585; G01R 15/09; G01R 19/16595; G01R 19/165; G01R 19/0038; G01R 15/04; G01R 19/16566; G01R 27/02; G01R 29/027
See application file for complete search history.

(56) References Cited

U.S. PATENT DOCUMENTS

| 5,640,626 | A | * | 6/1997 | Makiyama | ............... G03B 7/26 340/636.15 |
| 5,864,219 | A | | 1/1999 | Fink | |
| 7,271,579 | B2 | | 9/2007 | Shimada et al. | |
| 2005/0231988 | A1 | * | 10/2005 | Chi | ................... H02M 7/53875 363/98 |
| 2006/0261823 | A1 | | 11/2006 | Parker | |
| 2012/0293082 | A1 | * | 11/2012 | Huang | ................... H05B 45/54 315/192 |

FOREIGN PATENT DOCUMENTS

| CN | 201325803 Y | * | 10/2009 | |
| CN | 104518574 B | * | 9/2018 | .............. H02J 5/005 |
| CN | 109298223 | | 10/2020 | |
| JP | S525555 | | 1/1977 | |
| JP | 2008102094 | | 5/2008 | |
| JP | 2011043334 | | 3/2011 | |
| JP | 2013031082 | | 2/2013 | |

(Continued)

OTHER PUBLICATIONS

English translation of CN 104518574 B (Year: 2018).*

(Continued)

*Primary Examiner* — Jermele M Hollington
*Assistant Examiner* — Haidong Zhang
(74) *Attorney, Agent, or Firm* — JCIPRNET (57) ABSTRACT

A voltage monitoring device 2 includes: a comparator circuit 31; a state determination circuit 32; a pulse pattern setting circuit 33; an output circuit 36; a VDD port 21; a VSS port 22; an input port 24; and an output port 23. The comparator circuit 31 is connected to the state determination circuit 32. The state determination circuit 32 is connected to the pulse pattern setting circuit 33. The pulse pattern setting circuit is connected to the output port 23 via the output circuit 36.

20 Claims, 8 Drawing Sheets

(56) References Cited

FOREIGN PATENT DOCUMENTS

JP       2013234851     11/2013
WO      03075019      9/2003

OTHER PUBLICATIONS

English translation of CN 201325803 Y (Year: 2009).*
"Notice of Reasons for Refusal of Japan Counterpart Application", issued on Sep. 30, 2024, with English translation thereof, p. 1-p. 21.
"Notice of Reasons for Refusal of Japan Counterpart Application No. 2021-033072", issued on Dec. 24, 2024, with English translation thereof, p. 1-p. 10.
"Office Action of Europe Counterpart Application No. 22159106.8", issued on Dec. 19, 2024, p. 1-p. 9.

* cited by examiner

| STATE | VIN | Output Pulse Width | Output Pulse Number | Output Pulse Cycle |
|---|---|---|---|---|
| STATE1 | VIN≥VDET1 | 128ms | 2 | 1024ms |
| STATE2 | VDET1>VIN≥VDET2 | 128ms | 1 | 1024ms |
| STATE3 | VDET2>VIN≥VDET3 | 64ms | 1 | 1024ms |
| STATE4 | VDET3>VIN≥VDET4 | 32ms | 2 | 1024ms |
| STATE5 | VDET4>VIN | 32ms | 1 | 1024ms |

FIG. 16

VOLTAGE MONITORING DEVICE

CROSS-REFERENCE TO RELATED APPLICATION

This application claims the priority benefit of Japan application serial no. 2021-033072, filed on Mar. 3, 2021. The entirety of the above-mentioned patent application is hereby incorporated by reference herein and made a part of this specification.

BACKGROUND

Technical Field

The invention relates to a voltage monitoring device.

Description of Related Art

In recent years, in order to monitor a voltage, a voltage monitoring device using a window comparator circuit to monitor a voltage is known. The window comparator circuit uses multiple comparator circuits, and outputs whether a voltage of a monitoring target is within a set voltage range.

In the window comparator circuit, an output changes only when an input voltage crosses a threshold. If an output port is short-circuited with a power source internally when the output is at a high level, the output then constantly stays at the high level. Therefore, an anomaly of the voltage monitoring device cannot be determined.

SUMMARY

A voltage monitoring device according to the invention includes: a comparator circuit; a state determination circuit; a pulse pattern setting circuit; an output circuit; a VDD port; a VSS port; an input port; and an output port. The comparator circuit is connected to the state determination circuit. The state determination circuit is connected to the pulse pattern setting circuit. The pulse pattern setting circuit is connected to the output port via the output circuit.

DESCRIPTION OF THE EMBODIMENTS

The invention provides a voltage monitoring device capable of determining the occurrence of an anomaly of the voltage monitoring device itself.

According to the voltage monitoring device according to the invention, since a predetermined pulse group formed by a predetermined number of pulses and predetermined pulse widths set in advance in accordance with a voltage state of an input port is repetitively output at each predetermined pulse cycle, the state of the voltage monitoring device can be verified periodically. Accordingly, in the case where an anomaly in which the output port of the voltage monitoring device is short-circuited with a power source internally occurs, the anomaly of the voltage monitoring device can be determined.

In the following, the configurations for implementing the invention will be described in detail with reference to the drawings.

First Embodiment

Figure 1:
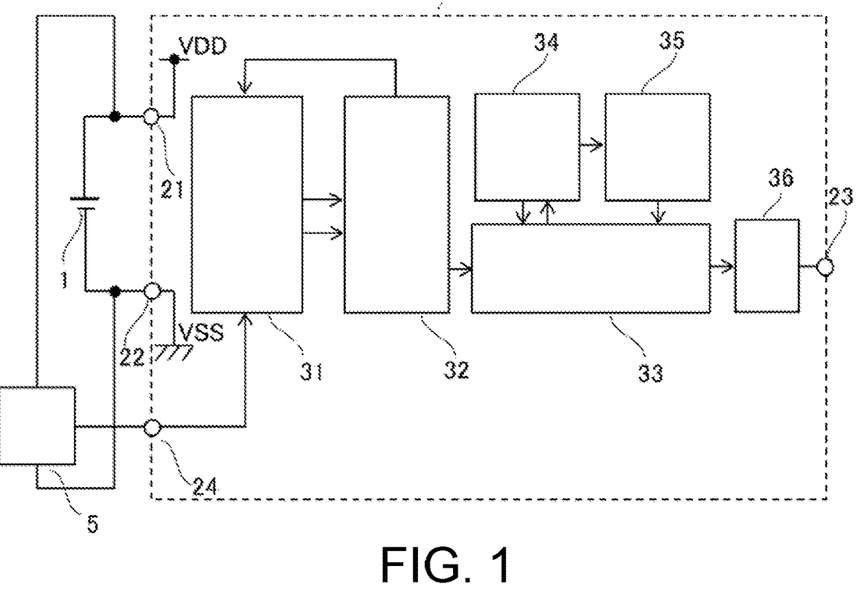
FIG. 1 is a block diagram illustrating a voltage monitoring device according to a first embodiment of the invention and the use thereof.

The configuration of the first embodiment of the invention will be described with reference to FIG. 1. FIG. 1 is a block diagram illustrating a voltage monitoring device 2 in the first embodiment of the invention and the use thereof. In FIG. 1, the voltage monitoring device 2 according to the embodiment includes a comparator circuit 31, a state determination circuit 32, a pulse pattern setting circuit 33, a reset circuit 34, a clock generation circuit 35, and an output circuit 36. In addition, the voltage monitoring device 2 includes a VDD port 21, a VSS port 22, an input port 24, and an output port 23.

The VDD port 21 is connected to a power VDD in the voltage monitoring device 2. The VSS port 22 is connected to a power VSS in the voltage monitoring device 2. The input port 24 is connected to the comparator circuit 31. The comparator circuit 31 is connected to the state determination circuit 32. The state determination circuit 32 is connected to the comparator circuit 31 and the pulse pattern setting circuit 33. The pulse pattern setting circuit 33 is connected to the state determination circuit 32, the reset circuit 34, the clock generation circuit 35, and an output circuit 36. The reset circuit 34 is connected to the pulse pattern setting circuit 33 and the clock generation circuit 35. The clock generation circuit 35 is connected to the reset circuit 34 and the pulse pattern setting circuit 33. The output circuit 36 is connected to the pulse pattern setting circuit 33 and the output port 23. Part of the description about the connection of the power VDD of each circuit with the power VSS in the voltage monitoring device 2 is omitted. A battery 1 is connected to the VDD port 21 and the VSS port 22, which are battery connection ports of the voltage monitoring device 2. A sensor 5 has three ports, which are two power ports and one output port. The sensor 5 operates by using the battery 1 as a power source. The sensor 5 applies, as an input voltage VIN, a voltage using the voltage of the VSS port 22 as the reference from the output port of the sensor 5 to the input port 24. The voltage monitoring device 2 outputs, from the output port 23, an output signal OUT corresponding to the voltage range of the voltage applied to the input port 24.

Figure 2:
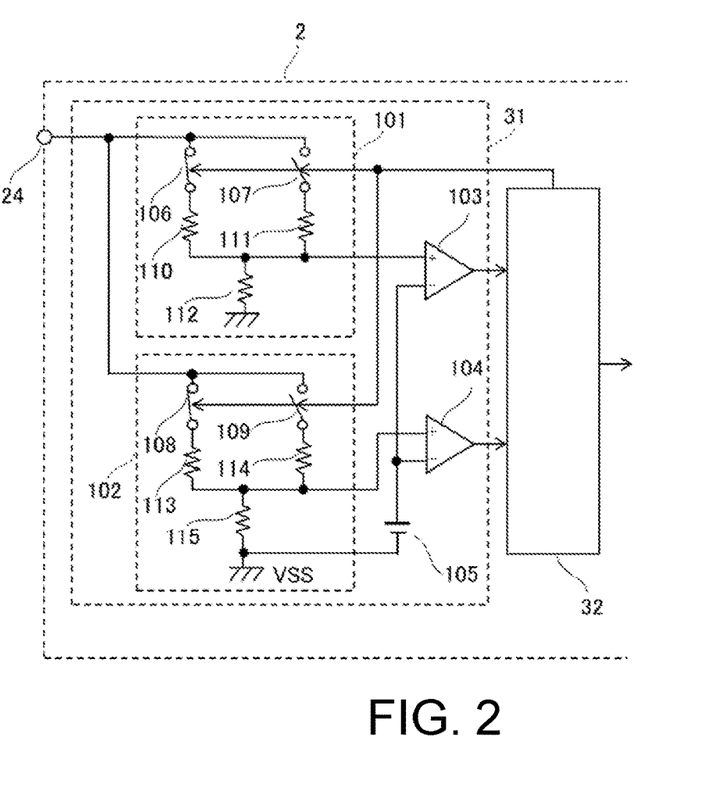
FIG. 2 is a circuit diagram illustrating a comparator circuit according to the first embodiment of the invention.

Then, the configuration of the comparator circuit 31 of the first embodiment of the invention is described with reference to FIG. 2. FIG. 2 is a circuit diagram illustrating the comparator circuit 31 according to the first embodiment of the invention. The comparator circuit 31 is configured by resistor circuits 101 and 102 generating voltages received by non-inverting input ports of comparators, comparators 103 and 104, and a voltage source 105. The resistor circuit 101 has switches 106 and 107 and resistors 110, 111, and 112. The switch 106, the resistor 110, and the resistor 112 are connected in series between the input port 24 and the power VSS. Similarly, the switch 107, the resistor 111, and the resistor 112 are connected in series between the input port 24 and the power VSS. The resistor circuit 102 has switches 108 and 109 and resistors 113, 114, and 115. The switch 108, the resistor 113, and the resistor 115 are connected in series between the input port 24 and the power VSS. Similarly, the switch 109, the resistor 114, and the resistor 115 are connected in series between the input port 24 and the power VSS. An inverting input port of the comparator 103 is connected to the power VSS via the voltage source 105, and a non-inverting input port of the comparator 103 is connected to the connection points of the resistors 110, 111, and 112. Similarly, an inverting input port of the comparator 104 is connected to the power VSS via the voltage source 105, and a non-inverting input port of the comparator 104 is connected to the connection points of the resistors 113, 114, and 115. The output ports of the comparators 103 and 104 are connected to the state determination circuit 32.

The state determination circuit 32 determines in which voltage range the input voltage VIN received by the input port 24 is located by using the voltage of the power VSS as the reference in accordance with the output determination result of the receiving comparators, and outputs a control signal setting ON/OFF of the switches 106, 107, 108, and 109 of the comparator circuit 31 to set a new monitoring voltage range in response to the determination. In addition, the state determination circuit 32 outputs in which monitoring voltage range the input voltage VIN is located to the pulse pattern setting circuit 33. The state determination circuit 32 can be configured by a logic circuit, a processor circuit, etc.

The pulse pattern setting circuit 33 receives the output signal of the state determination circuit 32, and outputs the output signal OUT, which is pulse like, corresponding to the voltage range of the input voltage VIN from the sensor 5 from the output port 23 via the output circuit 36. The pulse pattern of the output signal OUT is generated by using signals from the reset circuit 34 and the clock generation circuit 35. The operations of the pulse pattern setting circuit 33, the reset circuit 34, and the clock generation circuit 35 will be described afterwards.

The configuration of the output circuit 36 is described with reference to FIG. 3. The output circuit 36 includes an input port, an output port, a PMOS transistor 361, and an NMOS transistor 362. In the PMOS transistor 361, a gate is connected to the input port of the output circuit 36, a source is connected to the power VDD, and a drain is connected to the output port of the output circuit 36. In the NMOS transistor 362, a gate is connected to the input port of the output circuit 36, a source is connected to the power VSS, and a drain is connected to the output port of the output circuit 36.

The input voltage VIN of the input port 24 to which the sensor 5 is connected and the operation of the comparator circuit 31 and the state determination circuit 32 are described with reference to FIG. 2. The input voltage VIN is set as a voltage applied from the sensor 5 to the input port 24 by using the voltage of the VSS port 22 as the reference. The voltage source 105 supplies a reference voltage VREF to the inverting input ports of the comparators 103 and 104.

A voltage obtained by dividing the input voltage VIN by using the resistor circuit 101 is applied to the non-inverting input port of the comparator 103 by turning on one of the switches 106 and 107. When the switch 106 is ON, the input voltage VIN at the time when the voltage applied to the non-inverting input port of the comparator 103 is equal to the reference voltage VREF is set as a voltage VDET1. When the switch 107 is ON, the input voltage VIN at the time when the voltage applied to the non-inverting input port of the comparator 103 is equal to the reference voltage VREF is set as a voltage VDET3.

A voltage obtained by dividing the input voltage VIN by using the resistor circuit 102 is applied to the non-inverting input port of the comparator 104 by turning on one of the switches 108 and 109. When the switch 108 is ON, the input voltage VIN at the time when the voltage applied to the non-inverting input port of the comparator 104 is equal to the reference voltage VREF is set as a voltage VDET2. When the switch 109 is ON, the input voltage VIN at the time when the voltage applied to the non-inverting input port of the comparator 104 is equal to the reference voltage VREF is set as a voltage VDET4. The voltages VDET1, VDET2, VDET3, and VDET4 set the resistance values of the resistors 110 to 115 so as to form a relationship of voltage VDET1>voltage VDET2>voltage VDET3>voltage VDET4.

Figure 4:
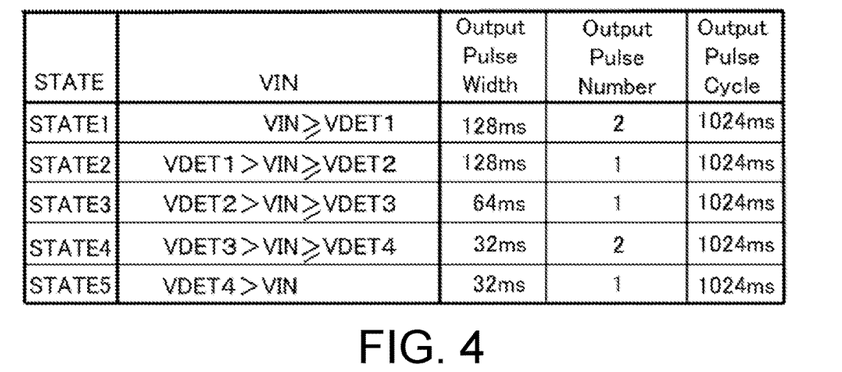
FIG. 4 is a diagram illustrating an example of the correspondence among a state, an input voltage, and an output signal of the voltage monitoring device according to the first embodiment of the invention.

Referring to FIG. 4, the relationship between the input voltage VIN, the voltages VDET1 to VDET4, and states (STATEs) are described. FIG. 4 is a diagram illustrating the correspondence among the state of the voltage monitoring device, the input voltage VIN, and the output signal OUT. The input voltage VIN sets STATE1 in a voltage state of being the voltage VDET1 or more. The input voltage VIN sets STATE2 in a voltage state of being the voltage VDET2 or more and less than the voltage VDET1. The input voltage VIN sets STATE3 in a voltage state of being the voltage VDET3 or more and less than the voltage VDET2. The input voltage VIN sets STATE4 in a voltage state of being the voltage VDET4 or more and less than the voltage VDET3. The input voltage VIN sets STATE5 in a voltage state of less than the voltage VDET4. Although the voltage boundary here is included in the higher STATE, whether the voltage boundary is included in the higher or lower STATE may be set arbitrarily.

In the comparator circuit 31 of FIG. 2, for example, the switches 106 and 108 are set to the ON state. The non-inverting input port of the comparator 103 receives a voltage obtained by dividing the input voltage VIN by using the resistors 110 and 112, and the non-inverting input port of the comparator 104 receives a voltage obtained by dividing the input voltage VIN by using the resistors 113 and 115. With such voltage relationship, in the comparator circuit 31, the upper side reference voltage for monitoring the input voltage VIN is set to the voltage VDET1, and the lower side reference voltage for monitoring the input voltage VIN is set to the voltage VDET2. Accordingly, the monitoring voltage range is set. Based on the output signal of the comparator circuit 31, the state determination circuit 32 determines in which voltage range of the voltage states (STATE1 to STATE5) the input voltage VIN is located, and outputs the determination result to the pulse pattern setting circuit 33. A control signal setting ON/OFF of the switches of the comparator circuit 31 is output to set a new monitoring voltage range in correspondence with the determination result.

Here, it is set that the input voltage VIN changes from the state of STATE2, which is a voltage stage of being the voltage VDET2 or more and less than the voltage VDET1, and drops lower than the voltage VDET2. The state determination circuit 32 outputs a control signal to turn off the switch 106 and turns on the switch 107. The monitoring voltage range of the comparator circuit 31 becomes a voltage range of being the voltage VDET3 or more and less than the voltage VDET2, and the voltage state in the case where the input voltage VIN is in such voltage range is STATE3. In the case where the input voltage VIN becomes a voltage less than the voltage VDET3 due to a further change, the state determination circuit 32 outputs a control signal to turn off the switch 108 and turn on the switch 109. The monitoring voltage range of the comparator circuit 31 becomes the voltage VDET4 or more and less than the voltage VDET3, and the voltage state of the case where the input voltage VIN is in such voltage range is STATE4. Accordingly, in accordance with the determination result of the comparator circuit 31, the state determination circuit 32 can switch the monitoring voltage range in order by outputting the switch control signal, and the comparator circuit 31 can monitor multiple voltage ranges by using two comparators. In the case where the input voltage VIN changes by rising, the voltage monitoring device performs an opposite switch switching operation.

Then, the operation of the entire voltage monitoring device 2 is described with reference to FIG. 1. The voltage monitoring device 2 can obtain the states (STATE) corresponding to the five voltage STATEs illustrated in FIG. 4 according to the monitoring voltages range obtained by the comparator circuit 31 and the state determination circuit 32. The state determination circuit 32 outputs, 1 to the pulse pattern setting circuit 33, the signal determining in which voltage range the output voltage VIN is located based on the output signals of the comparator circuit 3. Based on the clock signal supplied from the clock generation circuit 35, the pulse pattern setting circuit 33 repeats, in each predetermined pulse cycle, a predetermined pulse group formed by a predetermined pulse width and a predetermined pulse number set in advance in accordance with each state, and outputs the pulse group as a predetermined voltage pulse or current pulse via the output circuit 36. The state determination circuit 32 and the pulse pattern setting circuit 33 are formed by a processor circuit or a logic circuit operating by using a program.

The reset circuit 34 in each pulse cycle receives a signal for each predetermined cycle from the pulse pattern setting circuit to operate, and initializes the pulse pattern setting circuit 33 and the clock generation circuit 35. The pulse pattern setting circuit 33 repetitively outputs the predetermined pulse group formed by the predetermined pulse width and the predetermined pulse number in each predetermined pulse cycle.

Figure 5:
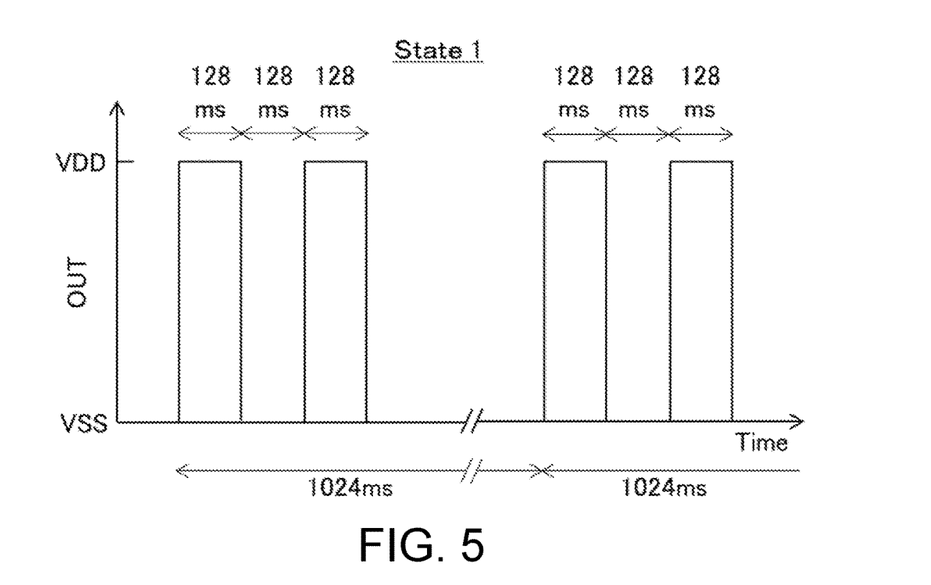
FIG. 5 is a diagram illustrating an example of the output signal of the voltage monitoring device according to the first embodiment of the invention.

An example of pulse pattern assignment of the embodiment is illustrated in FIG. 4. FIG. 4 illustrates a corresponding relationship among the respective voltage states (STATE), the input voltage VIN, the pulse width (Output Pulse Width), the number of pulses (Out Pulse Number) forming the pulse group, and the pulse cycle (Output Pulse Cycle). An example of the output signal OUT is illustrated in FIG. 5. For example, when the input voltage VIN is set to a voltage value (STATE1) of the voltage VDET1 or more, in the predetermined pulse group, two voltage pulses having a pulse width of 128 ms are emitted at a pulse interval of 128 ms, and the predetermined pulse cycle repetitively outputting the pulse group is 1024 ms. The combination of the pulse width, the pulse interval, and the pulse number in the predetermined pulse cycle is referred to as a pulse pattern. FIG. 5 illustrates the case where the output signal OUT is a voltage pulse. Nevertheless, the output signal OUT may also be a current pulse.

A microcomputer determining the voltage of the sensor 5 through the output signal OUT of the voltage monitoring device 2 can obtain the voltage information of the output port of the sensor 5 by determining the pulse width and the pulse number of the pulse group output by the voltage monitoring device 2. The microcomputer performs determination on the pulse group output by the voltage monitoring device 2 by using a master clock as reference. In the determination on the pulse group, the microcomputer, in each pulse cycle, measures the initial pulse width of the pulse group and the time until a subsequent pulse, and can determine the state (STATE) if, by using the time measured initially as reference, a pulse of the same waveform is counted to have the same number of pulses with the aforementioned time.

In the voltage monitoring device 2 of the embodiment, the pulse pattern of the output signal OUT is generated by using the clock generated by the clock generation circuit 35 as reference, and the clock generation circuit 35 is formed by a conventional oscillation circuit such as a CR oscillation circuit. The clock cycle output by the CR oscillation circuit exhibits variations depending on power voltage, temperature, etc. However, the state determination by the microcomputer, as described above, is performed by using the time measurement relating to the initial pulse pattern and the count of the subsequent same pulse pattern. The clock generation circuit 35 of the voltage monitoring device 2 is capable of outputting pulses allowing to determine the state even if the precision is not high. Therefore, the voltage monitoring device 2 is capable of easily and cost-effectively forming a voltage monitoring system without requiring a highly precise signal source such as a crystal oscillator.

As described above, the voltage monitoring device 2 of the embodiment, in each predetermined pulse cycle, repetitively outputs the predetermined pulse group formed by the predetermined pulse width and the predetermined pulse number in correspondence with the voltage range of the input voltage VIN. The voltage monitoring device 2 of the embodiment is capable of periodically verifying the input voltage VIN being located in the predetermined voltage range in each predetermined pulse cycle. Since the output voltage of the sensor 5 being located in the predetermined voltage range can be verified in each predetermined cycle by monitoring the predetermined pulse pattern by the microcomputer, etc., whether a monitoring circuit has a failure such as a wiring passage to the output port being short-circuited with the power, can be periodically determined. Although the comparator circuit 31 is formed with four reference voltages and five monitoring voltage ranges, by increasing switches and voltage-dividing resistors, it is possible to further divide the monitoring voltage ranges by increasing the voltages divided from the input voltage VIN and switching in order. In addition, the state of STATE1 or STATE5 can also be set so that the occurrence of an anomaly is determined on the monitoring side.

Here, a configuration in which the reset circuit 34 operates by receiving a signal, for each predetermined pulse cycle, from the pulse pattern setting circuit 33 is described. However, it may also be configured that the reset circuit 34 operates by receiving signals from the state determination circuit 32 as well as the pulse pattern setting circuit 33, and initializes the clock generation circuit 35 and the pulse pattern setting circuit 33 when the state determination circuit 32 changes or in each predetermined cycle from the pulse pattern setting circuit 33.

In the configuration, from a time point at which the output voltage of the sensor 5 changes to deviate from the predetermined voltage range and the state changes, the predetermined pulse pattern can be output. The sensor 5 is not particularly limited, as long as it outputs a voltage by a physical quantity that is sensed. For example, the sensor 5 may be a temperature sensor, a magnetic sensor, etc.

Second Embodiment

Figure 6:
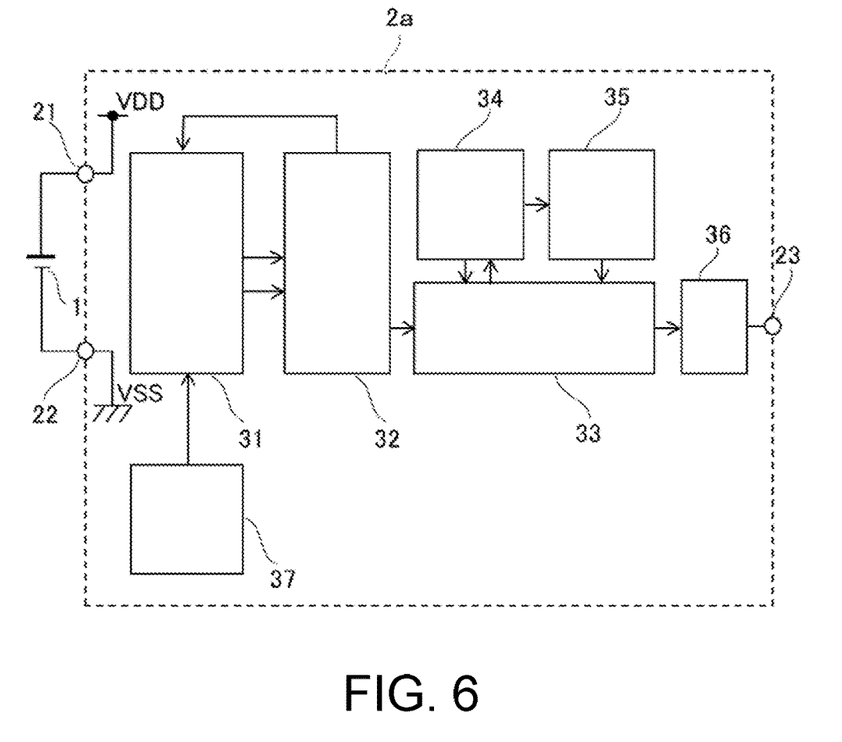
FIG. 6 is a block diagram illustrating a voltage monitoring device according to a second embodiment of the invention.

The configuration of a voltage monitoring device 2a of the second embodiment of the invention is described with reference to FIG. 6. The configuration components same as those of the first embodiment will be labeled with reference symbols same as those of the first embodiment, and the description thereof will be omitted. FIG. 6 is a block diagram illustrating the voltage monitoring device 2a in the second embodiment.

The voltage monitoring device 2a of the embodiment includes a sensor circuit 37 in place of the input port 24 of the voltage monitoring device 2 of the first embodiment. The comparator circuit 31 is connected to the sensor circuit 37, instead of the input port 24. The voltage monitoring device 2a of the embodiment applies a sensor voltage output by the sensor circuit 37 to the comparator circuit 31. The sensor voltage is compared by the comparators of the comparator circuit 31, the result is output to the state determination circuit 32.

The state determination circuit 32 determines in which voltage range the sensor voltage output by the sensor circuit 37 is located in accordance with the output determination result of the receiving comparator, and outputs a control signal setting ON/OFF of the switches 106, 107, 108, and 109 of the comparator circuit 31 to set a new monitoring voltage range in accordance with the determination. In addition, the state determination circuit 32 outputs a signal indicating in which monitoring voltage range the sensor voltage is located to the pulse pattern setting circuit 33. The pulse pattern setting circuit 33 receives the output signal of the state determination circuit 32, and outputs, via the output circuit 36, the pulse-like output signal OUT corresponding to the sensor voltage output by the sensor circuit 37.

As described above, the voltage monitoring device 2a of the embodiment, in each predetermined pulse cycle, repetitively outputs the predetermined pulse group formed by the predetermined pulse width and the predetermined pulse number in correspondence with the voltage range of the sensor voltage output by the sensor circuit 37. The voltage monitoring device 2a of the embodiment is capable of periodically verifying the sensor voltage output by the sensor circuit 37 being located in the predetermined voltage range in each predetermined pulse cycle. The sensor circuit 37 is not particularly limited, as long as it outputs a voltage by a physical quantity that is sensed. For example, the sensor circuit 37 may be a temperature sensor circuit, a magnetic sensor circuit, etc.

Third Embodiment

Figure 7:
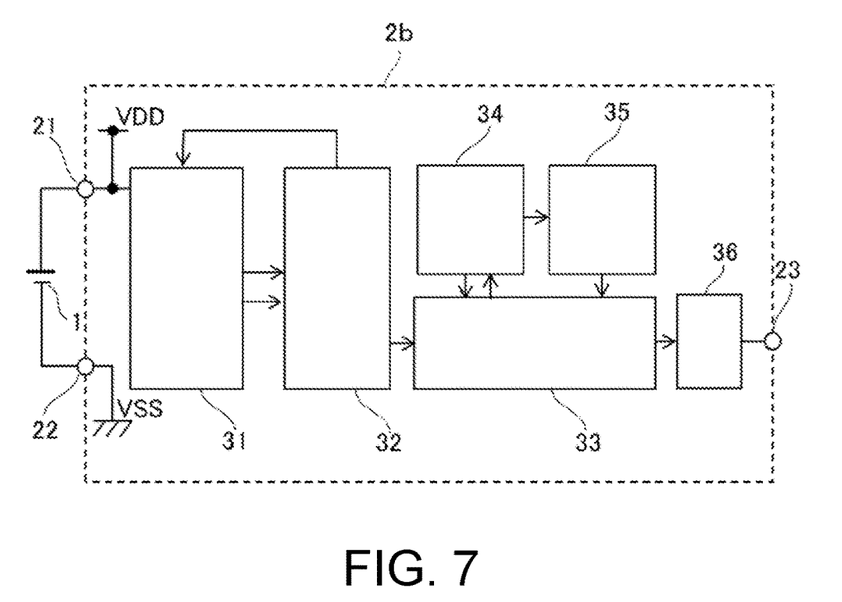
FIG. 7 is a block diagram illustrating a voltage monitoring device according to a third embodiment of the invention.

The configuration of a voltage monitoring device 2b of the third embodiment of the invention is described with reference to FIG. 7. The configuration components same as those of the first embodiment will be labeled with reference symbols same as those of the first embodiment, and the description thereof will be omitted. FIG. 7 is a block diagram illustrating the voltage monitoring device 2b in the third embodiment.

The voltage monitoring device 2b of the embodiment is configured by connecting the VDD port 21 to the comparator circuit 31 in place of the input port 24 of the voltage monitoring device 2 of the first embodiment. The VDD port 21 is connected to the power VDD and the comparator circuit 31 inside the voltage monitoring device 2b. The voltage monitoring device 2b of the embodiment applies a battery voltage VBAT of the battery 1 applied to the VDD port 21 to the comparator circuit 31. The battery voltage VBAT is compared with the voltage of the power VSS as reference by using the comparator of the comparator circuit 31, and the result is output to the state determination circuit 32.

The state determination circuit 32 determines in which voltage range the battery voltage VBAT of the battery 1 is located in accordance with the output determination result of the receiving comparators, and outputs a control signal setting ON/OFF of the switches 106, 107, 108, and 109 of the comparator circuit 31 to set a new monitoring voltage range in response to the determination. In addition, the state determination circuit 32 outputs a signal indicating in which monitoring voltage range the battery voltage VBAT is located to the pulse pattern setting circuit 33. The pulse pattern setting circuit 33 receives the output signal of the state determination circuit 32, and outputs, via the output circuit 36, the pulse-like output signal OUT corresponding to the voltage range of the battery voltage VBAT. Regarding the assignment of pulse pattern, when the battery voltage VBAT is high, a pulse with a large pulse width increasing the consumed current can be assigned, and when the battery 1 is consumed and the battery voltage VBAT is lowered, a small pulse with a pulse width reducing the consumed current can be assigned. By assigning the pulse pattern in this way, the lifetime of the battery when the battery voltage VBAT is low can be longer.

As described above, the voltage monitoring device 2b of the embodiment, in each predetermined pulse cycle, repetitively outputs the predetermined pulse group formed by the predetermined pulse width and the predetermined pulse number in correspondence with the voltage range of the battery voltage VBAT of the battery 1. The voltage monitoring device 2b of the embodiment is capable of periodically verifying the battery voltage VBAT of the battery 1 being located in the predetermined voltage range in each predetermined pulse cycle.

Fourth Embodiment

Figure 8:
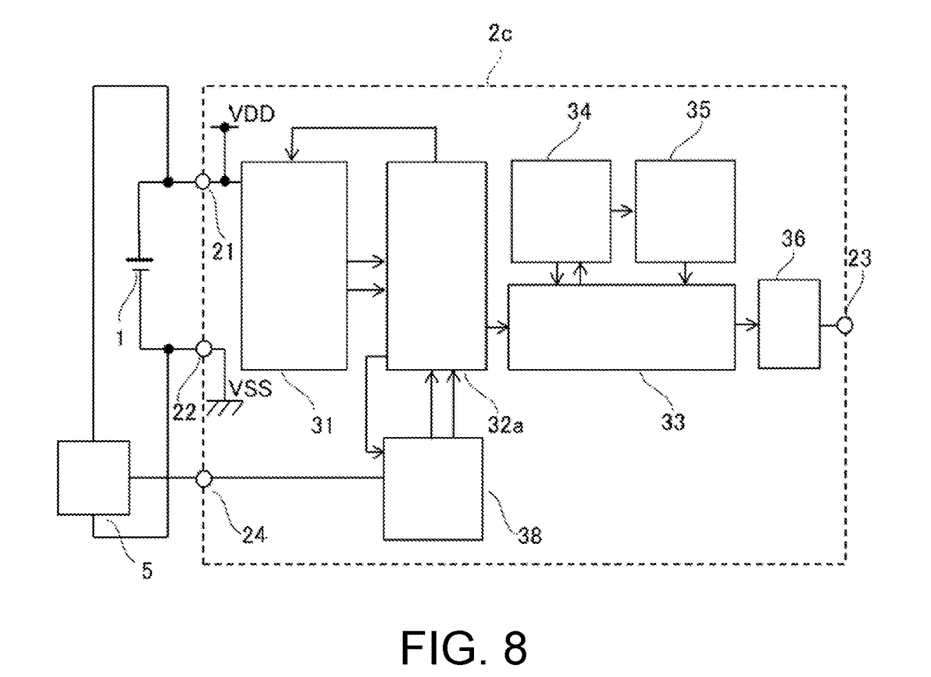
FIG. 8 is a block diagram illustrating a voltage monitoring device according to a fourth embodiment of the invention.

The configuration of a voltage monitoring device 2c of the fourth embodiment of the invention is described with reference to FIG. 8. The configuration components same as those of the first embodiment will be labeled with reference symbols same as those of the first embodiment, and the description thereof will be omitted. FIG. 8 is a block diagram illustrating the voltage monitoring device 2c in the fourth embodiment. The voltage monitoring device 2c of the embodiment is configured to include a second comparator circuit 38 with the same configuration of the comparator circuit 31 of the voltage monitoring device 2 of the first embodiment. Also, in place of the state determination circuit 32, the voltage monitoring device 2c of the embodiment includes a state determination circuit 32a. The state determination circuit 32a receives the output signals from the comparator circuit 31 and the second comparator circuit 38, and outputs a control signal setting the switches of the comparator circuit 31 and the second comparator circuit 38.

The input port 24 is connected to the state determination circuit 32a via the second comparator circuit 38. In the voltage monitoring device 2c of the embodiment, the VDD port 21 is connected to the power VDD and the comparator circuit 31 inside the voltage monitoring device 2c. In addition, the sensor 5 sets the battery 1 as the power, and applies the sensor voltage using the voltage of the VSS port 22 as reference to the input port 24. The input port 24 is connected to the second comparator circuit 38.

The comparator circuit 31 is connected to the state determination circuit 32a, and, similarly, the second comparator circuit 38 is connected to the state determination circuit 32a. The state determination circuit 32a outputs the signal indicating in which voltage ranges the monitoring voltage ranges of the comparator circuit 31 and the second comparator circuit 38 are located to the pulse pattern setting circuit 33. The pulse pattern setting circuit 33 receives the output signal of the state determination circuit 32a, and outputs, via the output circuit 36, the pulse-like output signal OUT corresponding to the voltages received by the VDD port 21 and the input port 24.

The pulse pattern output by the pulse pattern setting circuit 33 may be a pulse pattern representing any of 25 states combining the five voltage ranges (STATE) of the monitoring voltage ranges of the comparator circuit 31 and the second comparator circuit 38, respectively, and may also repeat the pulse pattern representing the voltage range of the comparator circuit 31 and the pulse pattern representing the voltage range of the second comparator circuit 38, where the pulse pattern of one of the comparator circuits may be output only at the time of a predetermined anomaly state.

As described above, the voltage monitoring device 2c of the embodiment, in each predetermined pulse cycle, repetitively outputs the predetermined pulse group formed by the predetermined pulse width and the predetermined pulse number in correspondence with the input voltage VIN received by the input port 24 and the voltage range of the battery voltage VBAT of the battery 1. The voltage monitoring device 2c of the embodiment is capable of periodically verifying the input voltage VIN and the battery voltage VBAT being located in the predetermined voltage range in each predetermined pulse cycle.

Fifth Embodiment

Figure 9:
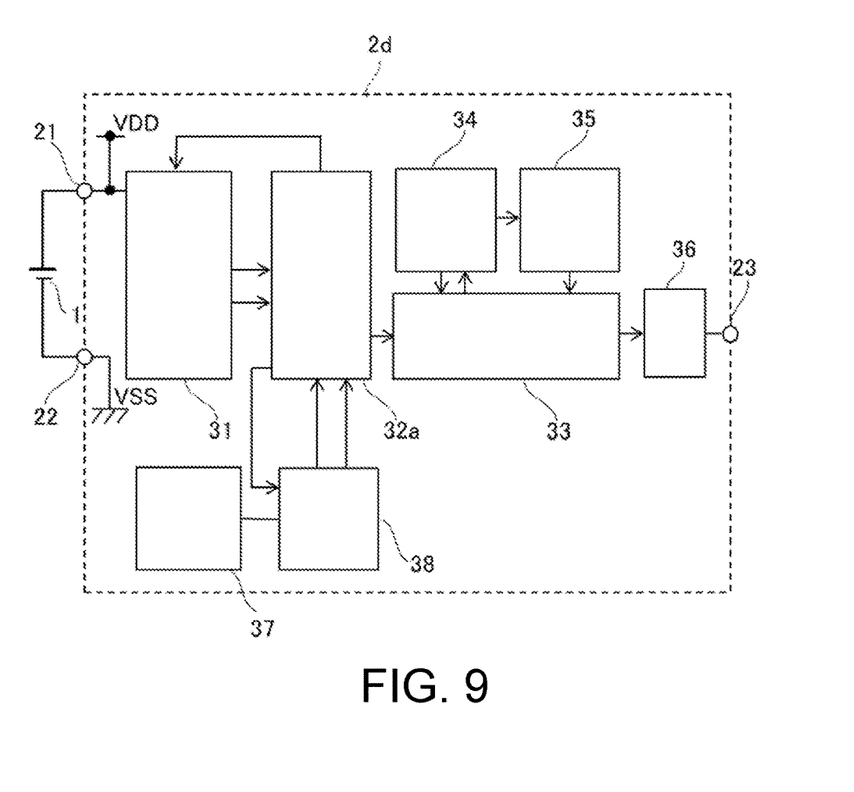
FIG. 9 is a block diagram illustrating a voltage monitoring device according to a fifth embodiment of the invention.

The configuration of a voltage monitoring device 2d of the fifth embodiment of the invention is described with reference to FIG. 9. The configuration components same as those of the fourth embodiment will be labeled with reference symbols same as those of the fourth embodiment, and the description thereof will be omitted. FIG. 9 is a block diagram illustrating the voltage monitoring device 2d in the fifth embodiment.

In the voltage monitoring device 2d of the embodiment, the VDD port 21 is connected to the comparator circuit 31. The VDD port 21 is connected to the power VDD and the comparator circuit 31 inside the voltage monitoring device 2d. In addition, the voltage monitoring device 2d of the fifth embodiment includes the sensor circuit 37 in place of the input port 24 of the voltage monitoring device 2c of the fourth embodiment. The sensor circuit 37 is connected to the second comparator circuit 38.

The comparator circuit 31 is connected to the state determination circuit 32a, and, similarly, the second comparator circuit 38 is connected to the state determination circuit 32a. The state determination circuit 32a outputs the signal indicating in which voltage range the monitoring voltage ranges of the comparator circuit 31 and the second comparator circuit 38 are located to the pulse pattern setting circuit 33. The pulse pattern setting circuit 33 receives the output signal of the state determination circuit 32a, and outputs, via the output circuit 36, the pulse-like output signal OUT corresponding to the voltages output from the VDD port 21 and the sensor circuit 37.

The pulse pattern output by the pulse pattern setting circuit 33 may be a pulse pattern representing any of 25 states combining the five voltage states (STATE) of the monitoring voltage ranges of the comparator circuit 31 and the second comparator circuit 38 respectively, and may also repeat the pulse pattern representing the voltage range of the comparator circuit 31 and the pulse pattern representing the voltage range of the second comparator circuit 38, where the pulse pattern of one of the comparator circuits may be output only at the time of a predetermined anomaly state.

As described above, the voltage monitoring device 2d of the embodiment, in each predetermined pulse cycle, repetitively outputs the predetermined pulse group formed by the predetermined pulse width and the predetermined pulse number in correspondence with the voltage ranges of the battery voltage VBAT of the battery 1 and the sensor voltage output from the sensor circuit 37. The voltage monitoring device 2d of the embodiment is capable of periodically verifying the battery voltage VBAT and the sensor voltage being located in the predetermined voltage ranges in each predetermined pulse cycle.

Sixth Embodiment

Figure 10:
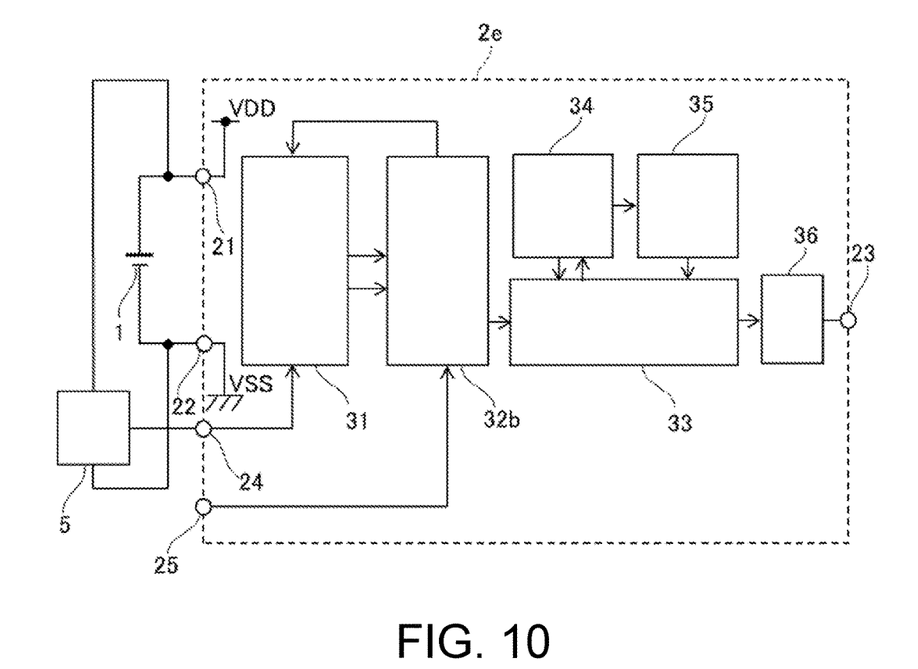
FIG. 10 is a block diagram illustrating a voltage monitoring device according to a sixth embodiment of the invention.

The configuration of a voltage monitoring device 2e of the sixth embodiment of the invention is described with reference to FIG. 10. The configuration components same as those of the first embodiment will be labeled with reference symbols same as those of the first embodiment, and the description thereof will be omitted. FIG. 10 is a block diagram illustrating a voltage monitoring device 2e in the sixth embodiment. The voltage monitoring device 2e of the embodiment includes an anomaly signal input port 25 in the voltage monitoring device 2 of the first embodiment. Also, in place of the state determination circuit 32, the voltage monitoring device 2e of the embodiment includes a state determination circuit 32b. The anomaly signal input port 25 is connected to the state determination circuit 32b. When the anomaly signal input port 25 receives an active signal, the state determination circuit 32b determines an anomaly state and outputs the anomaly state to the pulse pattern setting circuit 33. The pulse pattern setting circuit 33 receives the output signal of the state determination circuit 32b, and outputs the pulse-like output signal OUT in correspondence with the anomaly state.

Seventh Embodiment

Figure 11:
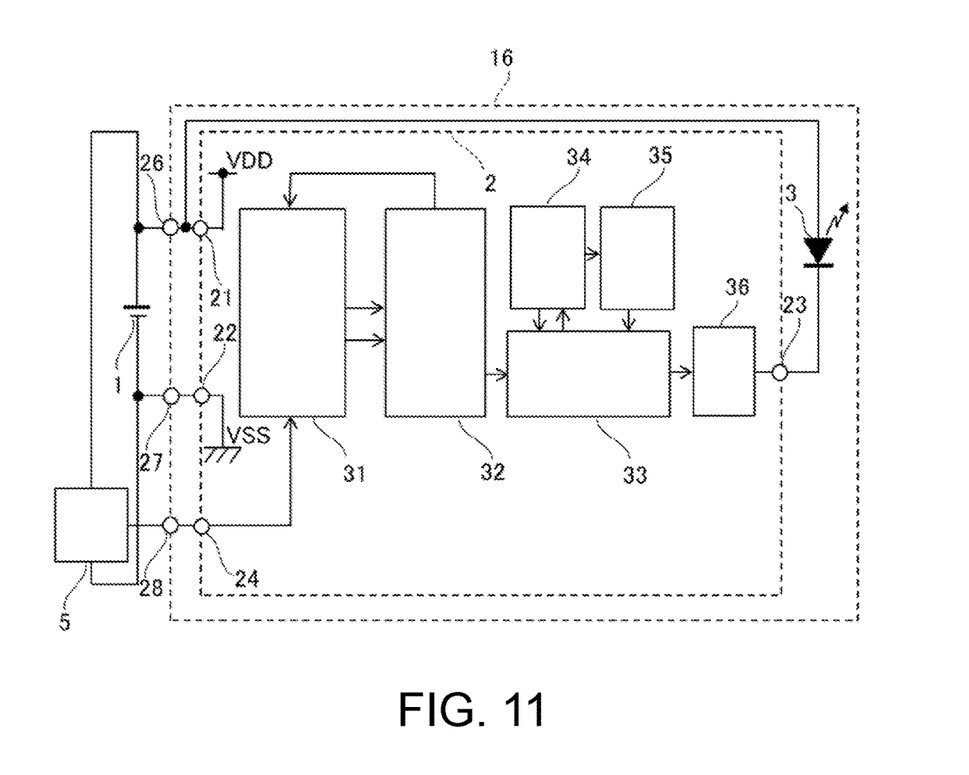
FIG. 11 is a block diagram illustrating a voltage monitoring device according to a seventh embodiment of the invention.

The configuration of the seventh embodiment of the invention will be described with reference to FIG. 11. The configuration components same as those of the first embodiment will be labeled with reference symbols same as those of the first embodiment, and the description thereof will be omitted. FIG. 11 is a block diagram illustrating a voltage monitoring device 16 in the seventh embodiment. The voltage monitoring device 16 of the embodiment includes the voltage monitoring device 2 of the first embodiment and a light emitting device 3. The light emitting device 3 of the embodiment is connected between the VDD port 21 and the output port 23 of the voltage monitoring device 2 of the first embodiment. The VDD port of the voltage monitoring device 2 is connected to the positive electrode of the battery 1 via a second VDD port 26, and the VSS port 22 of the voltage monitoring device 2 is connected to the negative electrode of the battery 1 via a second VSS port 27. The input port 24 is connected to the output port of the sensor 5 via the second input port 28.

The voltage monitoring device 16 of the embodiment makes the light emitting device 3 emit pulsed light by using a pulse pattern repeating, in each predetermined pulse pattern, the predetermined pulse group formed by the predetermined pulse width and the predetermined pulse number corresponding to the voltage range of the input voltage VIN from the sensor 5. The voltage monitoring device 16 of the embodiment is capable of periodically verifying the input voltage VIN output by the sensor 5 being located in the predetermined voltage range in each predetermined pulse cycle. The voltage monitoring device 16 of the embodiment is capable of insulated communication electrically insulating the battery 1 and the voltage monitoring device 16 by receiving the light emitted by the light emitting device 3 by using an emitted light reception device.

The output circuit 36 and the pulse pattern setting circuit 33 in the voltage monitoring device 16 is set as appropriate for the emitted light reception device to correctly receive the pulse pattern output by the light emitting device 3. The output circuit 36 is set to output an appropriate output current to make the light emitting device 3 to emit light of a light intensity allowing communication. In addition, the pulse pattern setting circuit 33 takes into consideration the light-on time and the light-off time required by the light emitting device 3 and is set with an appropriate pulse width.

Although the embodiment is formed by adding the light emitting device 3 to the voltage monitoring device 2 of the first embodiment, the embodiment may also be formed by adding the light emitting device 3 to the voltage monitoring device 2a of the second embodiment, the voltage monitoring device 2b of the third embodiment, the voltage monitoring device 2c of the fourth embodiment, the voltage monitoring device 2d of the fourth embodiment, and the voltage monitoring device 2d of the fifth embodiment. Examples of the light emitting device 3 may include a diode emitting infrared light, a diode emitting visible light, etc. Nevertheless, the light emitting device 3 is not limited thereto.

Eighth Embodiment

Figure 12:
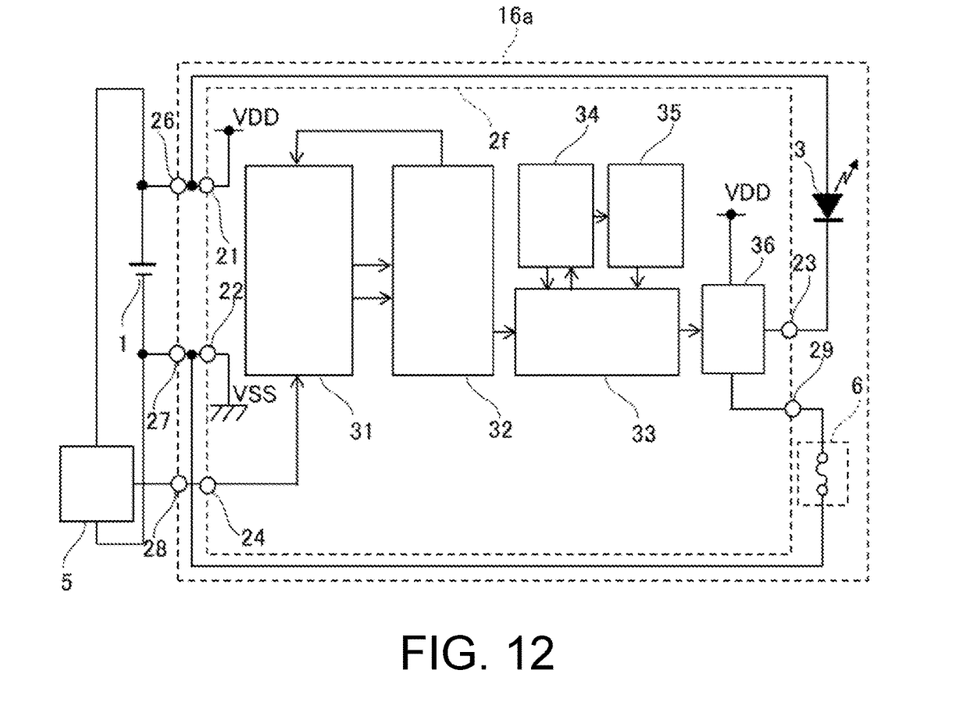
FIG. 12 is a block diagram illustrating a voltage monitoring device according to an eighth embodiment of the invention.

The configuration of the eighth embodiment of the invention will be described with reference to FIG. 12. The configuration components same as those of the seventh embodiment will be labeled with reference symbols same as those of the seventh embodiment, and the description thereof will be omitted. FIG. 12 is a block diagram illustrating a voltage monitoring device 16a in the eighth embodiment. The voltage monitoring device 16a of the embodiment is configured as a voltage monitoring device 2f in which the voltage monitoring device 2 of the seventh embodiment includes an anomaly current limiting device connection port 29. In the voltage monitoring device 2f, in place of the power VSS, the source of the NMOS transistor 362 of the output circuit 36 illustrated in FIG. 3 is connected to the anomaly current limiting device connection device 29. The voltage monitoring device 16a is formed by connecting an anomaly current limiting device 6 between the anomaly current limiting device connection port 29 and the VSS port 22. When a current having a current value set in advance or more flows between the ports, the anomaly current setting device 6 operates to limit the current value.

Figure 3:
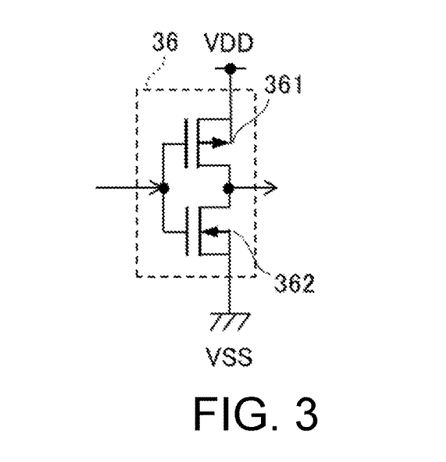
FIG. 3 is a circuit diagram illustrating an output circuit according to the first embodiment of the invention.

In the configuration, the case where the transistor of the output circuit 36 illustrated in FIG. 3 fails due to a short-circuited failure is considered. In the case where the PMOS transistor 361 fails due to a short-circuited failure, although a passing current flows to the anomaly current limiting device 6 via the output circuit 36 every time when a pulse pattern is performed, when a current having the current value set in advance or more flows between the ports of the anomaly current limiting device 6, the anomaly current can be limited since the anomaly current limiting device 6 operates to limit the current value. For a short-circuited failure of the NMOS transistor 362, like the above-described, the anomaly current can also be limited. Although the embodiment is formed by making addition to the seventh embodiment, such embodiment may also be formed by making addition to the first to sixth embodiments. Also, the same effect can be obtained with a configuration in which an anomaly current limiting device connection port 29a is provided at the source of the PMOS transistor 361 of the output circuit 36, the VDD port 21 is connected via the anomaly current limiting device connection port 29a, and the light emitting device 3 is connected at the output port 23.

Ninth Embodiment

Figure 13:
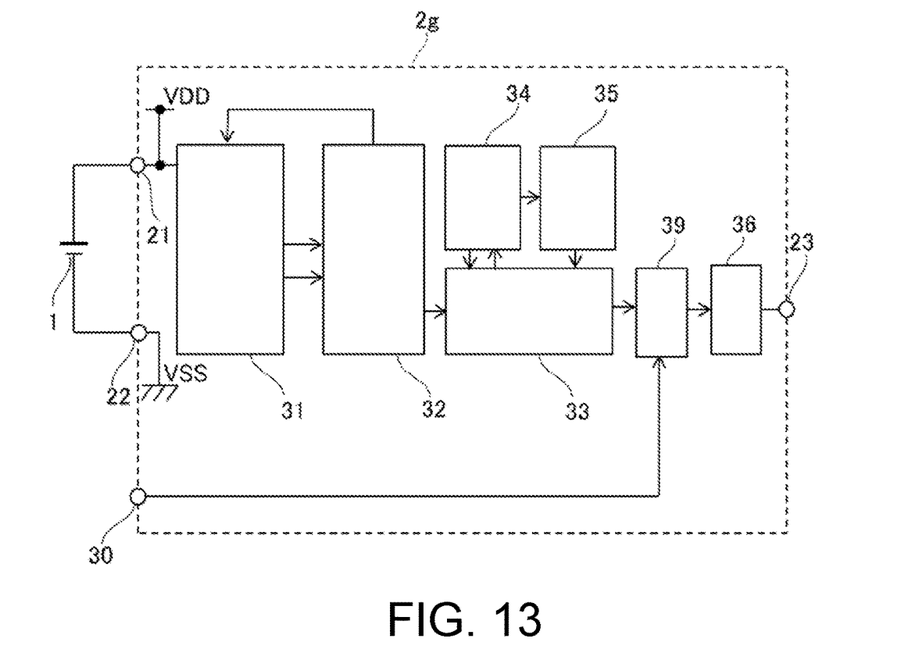
FIG. 13 is a block diagram illustrating a voltage monitoring device according to a ninth embodiment of the invention.

The configuration of the ninth embodiment of the invention will be described with reference to FIG. 13. The configuration components same as those of the third embodiment will be labeled with reference symbols same as those of the third embodiment, and the description thereof will be omitted. FIG. 13 is a block diagram illustrating a voltage monitoring device 2g in the ninth embodiment. The embodiment is to provide a communication port 30 and a pulse synthesis circuit 39 in the voltage monitoring device 2b of the third embodiment. The communication port 30 is configured to be connected with the output circuit 36 via the pulse synthesis circuit 39. The communication port 30 is externally connected with another voltage monitoring device in a daisy chain, and outputs the output signal OUT from the output port 23 by combining the monitoring state of the another voltage monitoring device.

The pulse synthesis circuit 39 is provided between the pulse pattern setting circuit 33 and the output circuit 36, and outputs a sum of the signal from the pulse pattern setting circuit 33 and the signal from the communication port 30 to the output circuit 36.

Figure 14:
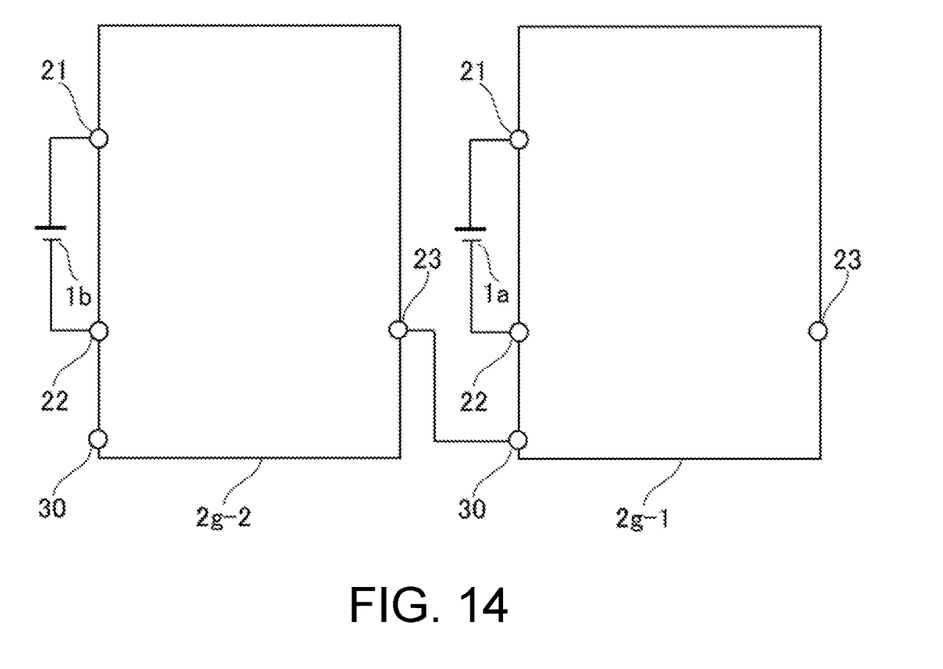
FIG. 14 is a diagram illustrating an example of connecting the voltage monitoring device according to the ninth embodiment of the invention.

FIG. 14 is an example of a configuration in which the voltage monitoring devices 2g are connected in a daisy chain. The communication port 30 of a first voltage monitoring device 2g-1 of the embodiment is connected to the output port 23 of a second voltage monitoring device 2g-2. The communication port 30 of the second voltage monitoring device 2g-2 is connected to a third voltage monitoring device 2g-3 not illustrated herein. The voltage monitoring device of the embodiment can collectively output multiple battery monitoring results from the first voltage monitoring device 2g-1 at the final stage. As described above, the microcomputer can determine the state (STATE) if the number of subsequent pulses is determined by using the initial pulse width as the time reference. Therefore, clock synchronization is not required among the respective voltage monitoring devices. Therefore, the communication load of the processing circuits can be reduced, and the monitoring system for multiple voltages can be easily and cost-effectively configured.

So far, the pulse cycle has been described by setting at 1024 ms as an example. However, when the signals from multiple voltage monitoring devices are collected in a daisy chain connection, the pulse cycle may be set longer, such as 60 seconds (60 s), thereby being able to avoid conflicts among output signals.

Tenth Embodiment

Figure 15:
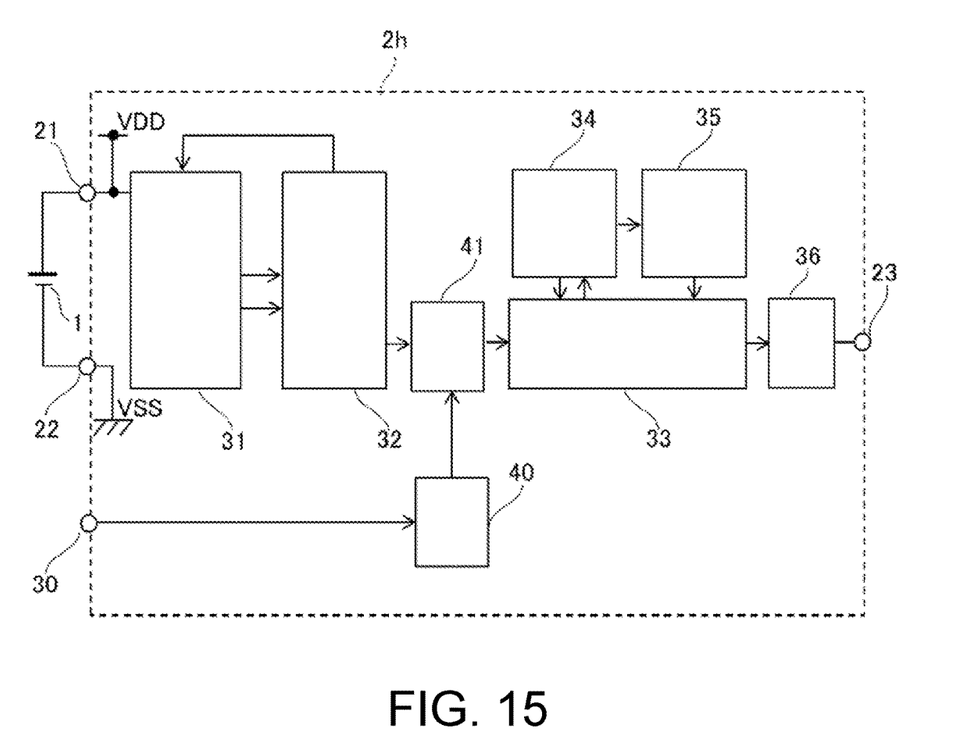
FIG. 15 is a block diagram illustrating a voltage monitoring device according to a tenth embodiment of the invention.

The configuration of the tenth embodiment of the invention will be described with reference to FIG. 15. The configuration components same as those of the third embodiment will be labeled with reference symbols same as those of the third embodiment, and the description thereof will be omitted. FIG. 15 is a block diagram illustrating a voltage monitoring device 2h in the tenth embodiment. The embodiment is to provide the communication port 30, a pulse determination circuit 40, and a state comparator circuit 41 in the voltage monitoring device 2b of the third embodiment. The communication port 30 is configured to be connected with the state comparator circuit 41 via the pulse determination circuit 40. The state comparator circuit 41 is configured by connecting the state determination circuit 32 and the pulse determination circuit 40 to the pulse pattern setting circuit 33. The communication port 30 is externally connected with another voltage monitoring device in a daisy chain, and outputs the output signal OUT from the output port 23 by combining the monitoring state of the another voltage monitoring device.

The pulse determination circuit 40 receives the pulse signal from the communication port 30, and outputs a state (STATE) signal indicated by the pulse signal to the state comparator circuit 41. The state comparator circuit 41 compares the state (STATE) signal from the state determination circuit 32 and the state (STATE) signal from the pulse determination circuit 40 against a predetermined reference, and outputs the state (STATE) signal determined to be more important to the pulse pattern setting circuit 33.

Figure 16:
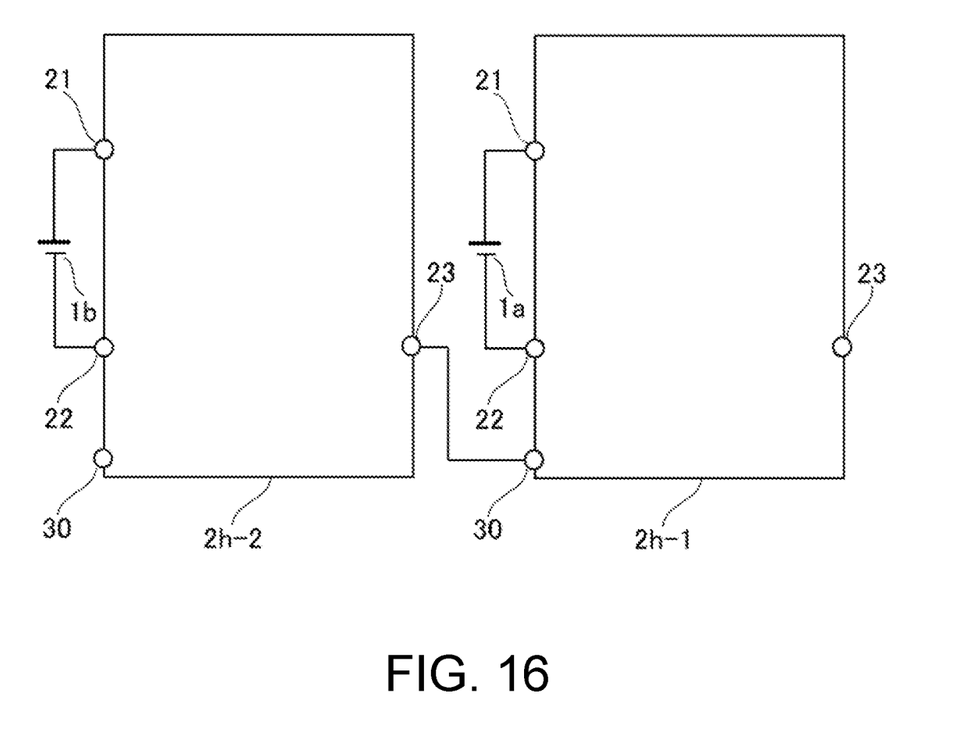
FIG. 16 is a diagram illustrating an example of connecting the voltage monitoring device according to the tenth embodiment of the invention.

FIG. 16 is an example of a configuration in which the voltage monitoring devices 2h are connected in a daisy chain. The communication port 30 of a first voltage monitoring device 2h-1 of the embodiment is connected to the output port 23 of a second voltage monitoring device 2h-2. The communication port 30 of the second voltage monitoring device 2h-2 is connected to a third voltage monitoring device 2h-3 not illustrated herein. The voltage monitoring device of the embodiment is cable of outputting, from the voltage monitoring device 2h-1, the most important monitoring result among multiple battery monitoring results. As described above, the microcomputer can determine the state (STATE) if the number of subsequent pulses is determined by using the initial pulse width as the time reference. Therefore, clock synchronization is not required among the respective voltage monitoring devices. Therefore, the communication load of the processing circuits can be reduced, and the monitoring system for multiple voltages can be easily and cost-effectively configured.

In view of the foregoing, according to the voltage monitoring device according to the invention, since a predetermined pulse group formed by the predetermined number of pulses and the predetermined pulse width set in advance in accordance with the monitoring voltage state is repetitively output at the predetermined pulse cycle, the monitoring voltage state can be verified periodically. Accordingly, in the case where an anomaly in which the output port of the voltage monitoring device is short-circuited with a power source internally occurs, the anomaly of the voltage monitoring device can be determined.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A voltage monitoring device, comprising: a comparator circuit; a state determination circuit; a pulse pattern setting circuit; an output circuit; a VDD port; a VSS port; an input port; and an output port,
   wherein the comparator circuit is connected to the state determination circuit,
   the state determination circuit is connected to the pulse pattern setting circuit,
   the pulse pattern setting circuit is connected to the output port via the output circuit, and
   the state determination circuit outputs signals controlling the comparator circuit.

2. The voltage monitoring device as claimed in claim 1, wherein:
   the comparator circuit has two resistor circuits, two comparators, and a voltage source,
   each of the resistor circuits has a plurality of switches controlled by the state determination circuit and a plurality of voltage-dividing resistors connected to the switches,
   each of the resistor circuits divides a voltage received by the respective resistor circuit by using the voltage-dividing resistors selected by the switches and inputs a divided voltage to one of the comparators corresponding to the respective resistor circuit,
   each of the comparators receives the divided voltage from the respective resistor circuit and a voltage from the voltage source, and outputs a comparison result to the state determination circuit, and
   the state determination circuit outputs signals controlling the switches of the resistor circuits and a signal controlling the pulse pattern setting circuit in accordance with outputs of the comparators of the comparator circuit.

3. The voltage monitoring device as claimed in claim 1, wherein:
   a voltage received by the comparator circuit is a voltage received from the input port.

4. The voltage monitoring device as claimed in claim 1, further comprising:
   a sensor circuit, wherein a voltage received by the comparator circuit is a voltage received from the sensor circuit.

5. The voltage monitoring device as claimed in claim 1, wherein:
a voltage received by the comparator circuit is a voltage received from the VDD port.

6. The voltage monitoring device as claimed in claim 1, further comprising:
a second comparator circuit,
wherein a voltage received by the second comparator circuit is a voltage received from the input port, and
signals received by the state determination circuit are signals received from the comparator circuit and the second comparator circuit.

7. The voltage monitoring device as claimed in claim 1, further comprising:
a sensor circuit; and a second comparator circuit,
wherein a voltage received by the second comparator circuit is a voltage received from the sensor circuit, and
signals received by the state determination circuit are signals received from the comparator circuit and the second comparator circuit.

8. The voltage monitoring device as claimed in claim 1, further comprising:
an anomaly signal input port,
wherein the state determination circuit receives a signal received by the anomaly signal input port.

9. The voltage monitoring device as claimed in claim 1, further comprising:
a light emitting device,
wherein the light emitting device is connected to the output port and the VDD port.

10. The voltage monitoring device as claimed in claim 1, further comprising:
an anomaly current limiting device connection port; and an anomaly current limiting device,
wherein the output circuit has a PMOS transistor and an NMOS transistor,
a source of the NMOS transistor is connected to the anomaly current limiting device connection port, and
the anomaly current limiting device is connected to the anomaly current limiting device connection port.

11. The voltage monitoring device as claimed in claim 1, further comprising:
a communication port; and a pulse synthesis circuit,
wherein the pulse pattern setting circuit and the communication port are connected to the pulse synthesis circuit, and
the pulse synthesis circuit is connected to the output port via the output circuit.

12. The voltage monitoring device as claimed in claim 1, further comprising:
a communication port; a pulse determination circuit; and a state comparator circuit,
wherein the communication port is connected to the state comparator circuit via the pulse determination circuit, and
the state comparator circuit is connected to the state determination circuit, the pulse determination circuit, and the pulse pattern setting circuit.

13. The voltage monitoring device as claimed in claim 2, wherein:
a voltage received by the comparator circuit is a voltage received from the input port.

14. The voltage monitoring device as claimed in claim 2, further comprising:
a sensor circuit,
wherein a voltage received by the comparator circuit is a voltage received from the sensor circuit.

15. The voltage monitoring device as claimed in claim 2, wherein:
a voltage received by the comparator circuit is a voltage received from the VDD port.

16. The voltage monitoring device as claimed in claim 2, further comprising:
a second comparator circuit,
wherein a voltage received by the second comparator circuit is a voltage received from the input port, and
signals received by the state determination circuit are signals received from the comparator circuit and the second comparator circuit.

17. The voltage monitoring device as claimed in claim 2, further comprising:
a sensor circuit; and a second comparator circuit,
wherein a voltage received by the second comparator circuit is a voltage received from the sensor circuit, and
signals received by the state determination circuit are signals received from the comparator circuit and the second comparator circuit.

18. The voltage monitoring device as claimed in claim 8, further comprising:
a light emitting device,
wherein the light emitting device is connected to the output port and the VDD port.

19. The voltage monitoring device as claimed in claim 8, further comprising:
an anomaly current limiting device connection port; and an anomaly current limiting device,
wherein the output circuit has a PMOS transistor and an NMOS transistor,
a source of the NMOS transistor is connected to the anomaly current limiting device connection port, and
the anomaly current limiting device is connected to the anomaly current limiting device connection port.

20. The voltage monitoring device as claimed in claim 9, further comprising:
an anomaly current limiting device connection port; and an anomaly current limiting device,
wherein the output circuit has a PMOS transistor and an NMOS transistor,
a source of the NMOS transistor is connected to the anomaly current limiting device connection port, and
the anomaly current limiting device is connected to the anomaly current limiting device connection port.

* * * * *